United States Patent
Arkles et al.

(10) Patent No.: US 12,060,373 B2
(45) Date of Patent: *Aug. 13, 2024

(54) CHALCOGENOSILACYCLOPENTANES

(71) Applicant: Gelest, Inc., Morrisville, PA (US)

(72) Inventors: Barry C. Arkles, Pipersville, PA (US); Richard J. Liberatore, Philadelphia, PA (US); Youlin Pan, Langhorne, PA (US)

(73) Assignee: GELEST, INC., Morrisville, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/985,990

(22) Filed: Nov. 14, 2022

(65) Prior Publication Data

US 2023/0098287 A1 Mar. 30, 2023

Related U.S. Application Data

(63) Continuation of application No. 16/826,589, filed on Mar. 23, 2020, now Pat. No. 11,542,284.

(60) Provisional application No. 62/827,970, filed on Apr. 2, 2019.

(51) Int. Cl.
  *C07F 7/08* (2006.01)
  *C07F 7/18* (2006.01)
  *C23C 16/455* (2006.01)

(52) U.S. Cl.
  CPC .......... *C07F 7/0816* (2013.01); *C07F 7/0896* (2013.01); *C07F 7/1896* (2013.01); *C23C 16/45553* (2013.01)

(58) Field of Classification Search
  CPC .................................................... C07F 7/0816
  See application file for complete search history.

(56) References Cited

U.S. PATENT DOCUMENTS

| | | | |
|---|---|---|---|
| 8,022,129 | B2 | 9/2011 | Tadaki et al. |
| 2010/0317818 | A1 | 12/2010 | Hogan et al. |
| 2013/0237082 | A1 | 9/2013 | Zhou |
| 2018/0119276 | A1 | 5/2018 | Lei et al. |
| 2018/0142126 | A1 | 5/2018 | Arkles et al. |

FOREIGN PATENT DOCUMENTS

| | | | |
|---|---|---|---|
| JP | 2009149980 A | 7/2009 |
| JP | 2012256886 A | 12/2012 |
| JP | 2016222927 A | 12/2016 |
| JP | 2018524303 A | 8/2018 |
| TW | 201825640 A | 7/2018 |
| WO | 2008156788 A2 | 12/2008 |
| WO | 2016205073 A1 | 12/2016 |

OTHER PUBLICATIONS

Chinese Office Action issued on May 31, 2023, in counterpart Chinese Patent Application No. 202080027501.2.
Notice of Allowance issued on Jun. 20, 2023, in counterpart Japanese Patent Application No. 2021-560204.
STN, Registry, RN 2562-47-4, pp. 1-2 (Nov. 16, 1984).
International Search Report and Written Opinion issued May 26, 2020 in International Application No. PCT/US2020/024127.
Dubac et al., "A new ring expansion reaction of sulfur dioxide with germacyclobutanes," Comptes Rendus Des Seances De L'Academie Des Sciences, Serie C: Sciences Chimiques, vol. 267, No. 5, pp. 411-413 (1968) (with English Abstract).
Dubac et al., "Sultones Organometalliques IV. Reactions de Sulfonation en Serie Silacyclobutanique," Journal of Organometallic Chemistry, vol. 25, pp. 367-384 (1970) (with English Summary).
Office Action and Search Report issued Jan. 21, 2021 in TW Application No. 109109631 (with Brief Summary of Relevant Portions of Office Action).
Poon et al., "Regenerable Antioxidants—Introduction of Chalcogen Substituents into Tocopherols," Chemistry: A European Journal, vol. 21, pp. 2447-2457 (2015).
Tanini et al., "Chalcogenides-incorporating carbonic anhydrase inhibitors concomitantly reverted oxaliplatin-induced neuropathy and enhanced antiproliferative action," European Journal of Medicinal Chemistry, vol. 225, pp. 1-12 (2021).
Office Action issued Jul. 12, 2022 in EP Application No. 20719865.6.

(Continued)

*Primary Examiner* — Margaret G Moore
(74) *Attorney, Agent, or Firm* — Panitch Schwarze Belisario & Nadel LLP

(57) ABSTRACT

A new class of compounds known as chalcogenosilacyclopentanes is described. These compounds are five-membered ring structures containing a silicon-selenium or silicon-tellurium bond, as shown in Formulas (I) and (II). In these compounds, the substituents on the silicon and on the ring carbons may be hydrogen, alkyl, alkoxy, aromatic, or ether groups. The chalcogenosilacyclopentane compounds undergo ring-opening reactions with hydroxyl and other protic functionalities and may be used to prepare substrates that are amenable to thin film deposition techniques such as ALD and CVD.

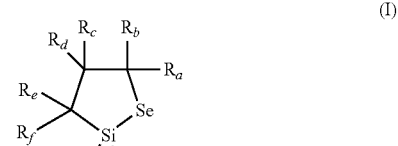

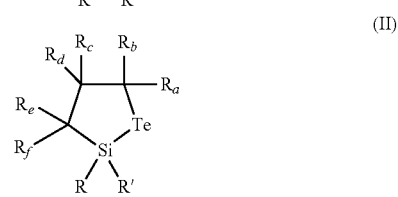

13 Claims, No Drawings

(56) References Cited

OTHER PUBLICATIONS

Office Action issued Oct. 3, 2022 in JP Application No. 2021-560204.
Office Action dated Aug. 3, 2022 in U.S. Appl. No. 16/826,589 of Arkles et al.
Office Action issued Jan. 18, 2024 in KR Application No. 10-2021-7033004.
Office Action issued Aug. 28, 2023 in EP Application No. 20719865.6.
Office Action issued Mar. 23, 2024 in CN Application No. 2020800275012.

CHALCOGENOSILACYCLOPENTANES

CROSS-REFERENCE TO RELATED APPLICATION

This application is a continuation of U.S. patent application Ser. No. 16/826,589, now U.S. Pat. No. 11,542,284, filed Mar. 23, 2020, which claims priority to U.S. provisional patent application number 62/827,970, filed Apr. 2, 2019, the disclosures of which are herein incorporated by reference in their entirety.

BACKGROUND OF THE INVENTION

In thin film technologies, surfaces are generally modified to present a specific chemical functionality or to modify substrate behavior to enable a deposition technology. The latter case is particularly important in technologies where ultra-thin conformal layers are required. For example, atomic layer deposition (ALD) technology is becoming increasingly important in cadmium selenide and cadmium telluride thin film compositions for photovoltaic applications, in mercury-cadmium telluride (HgCdTe) deposition for sensor applications, and in germanium-antimony-tellurium (GST) deposition in phase change memory and capacitor applications. A general problem that has been observed in these thin film deposition schemes is slow growth per cycle in the initial stages of ALD, sometimes referred to as incubation or induction in the ALD process. Often, this slow growth is associated with the reactivity of a substrate which is not of the same composition as the film to be deposited. There remains a need in the art for substrates which can efficiently initiate deposition processes.

SUMMARY OF THE INVENTION

A chalcogenosilacyclopentane having formula (I) or (II) is described, wherein $R_a$, $R_b$, $R_c$, $R_d$, $R_e$, $R_f$, R, and R' are each independently selected from the group consisting of hydrogen, an alkyl group having one to about 8 carbon atoms, an alkoxy group having one to about 8 carbon atoms, an aromatic group, and an ether group.

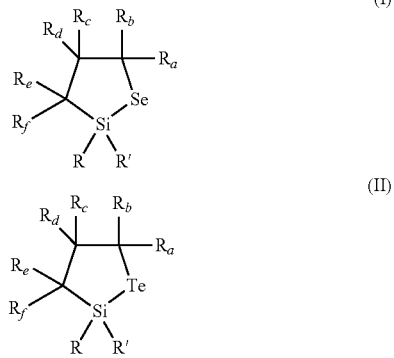

DETAILED DESCRIPTION OF THE INVENTION

The invention relates to a series of new heterocyclic silanes, known as chalcogenosilacyclopentanes. The term "chalcogen" refers to elements in Group 16 of the Periodic Table, and chalcogens encompassed by the invention include selenium (Se) and tellurium (Te). Thus, the invention more specifically relates to selenosilacyclopentanes and tellurosilacyclopentanes. These compounds undergo desirable ring-opening reactions with hydroxyl and other protic functionalities. Further, surface modification by these materials leads to substrates that are amenable to thin film deposition technologies such as ALD (atomic layer deposition) and CVD (chemical vapor deposition).

The selenosilacyclopentanes and tellurosilacyclopentanes according to the invention are 5-membered ring structures containing a silicon-selenium bond or a silicon-tellurium bond, as shown in the following compounds having formulas (I) and (II).

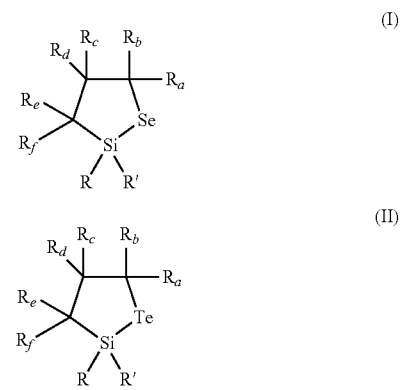

The simplest members of the chalcogenosilacyclopentanes according to the invention have no substitution on the ring or on the silicon, i.e., all of the $R_a$ to $R_f$, R, and R' substituents are hydrogen atoms, as shown in the compounds having formula (III) and (IV) below:

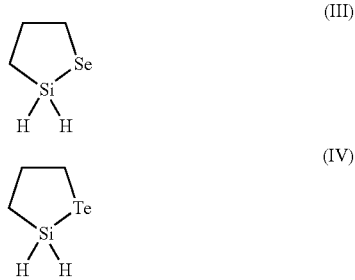

More generally, the substituents on the ring carbons $R_a$ to $R_f$ and the substituents on the silicon atom R and R' may each independently be hydrogen or an organic group selected from alkyl and alkoxy groups having one to about eight, more preferably four or less, carbon atoms, aromatic groups, and ether groups. More preferably, the substituents are hydrogen, alkyl, or alkoxy groups, more preferably hydrogen, methyl, methoxy, or ethoxy groups. For examples, chalcogenosilacyclopentanes in which the silicon atom and one of the ring carbons are substituted with methyl groups, 2,2,4-trimethyl-1-selena-2-silacyclopentane and 2,2,4-trimethyl-1-tellura-2-silacyclopentane are shown below in formulas (V) and (VI).

(V)

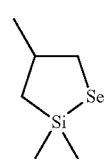

(VI)

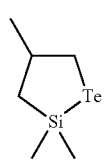

Examples of other possible compounds according to the invention include, but are not limited to, compounds having the following structures:

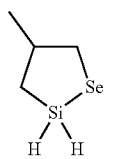 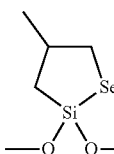 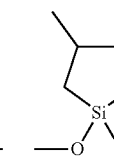 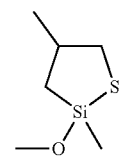

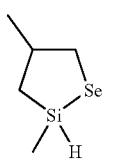 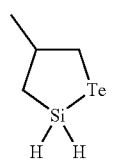 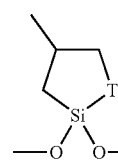 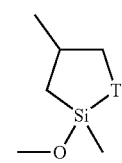

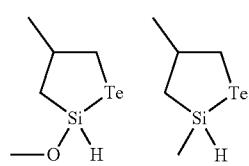

The chalcogenosilacyclopentanes according to the invention may be prepared by reaction of 3-chloroisobutyldimethylchlorosilane with a lithium chalcogenide, as shown in Scheme I:

Scheme I

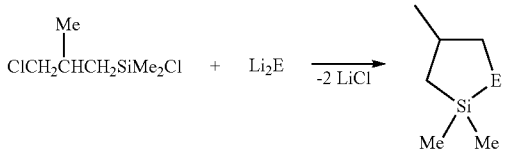

E = Se and Te

The inventive compounds may alternatively be prepared by reaction of 3-chloroisobutyltrialkoxysilane with a lithium chalcogenide, as shown in Scheme II:

Scheme II

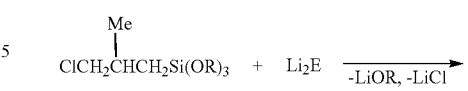

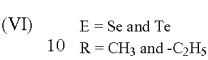

E = Se and Te
R = $CH_3$ and $-C_2H_5$

Analogous reactions may be performed to produce alternative compounds according to the invention which do not contain a methyl substituent at the 4 position of the silacyclopentane ring. Such reactions would be well understood in the art. The alkoxy-substituted compounds may be reduced using lithium aluminum hydride or diisobutyl aluminum hydride to produce the inventive compounds having hydrogen substituents on the silicon.

The inventive materials undergo ring-opening reactions with protic substrates such as those containing hydroxyl, thiol, and amine groups, yielding the elements of C—Se—H (selenol) or C—Te—H (tellurol) in a distal position with respect to the substrate. The general and specific (for Te) ring-opening reactions are shown in Schemes III and IV.

Scheme III

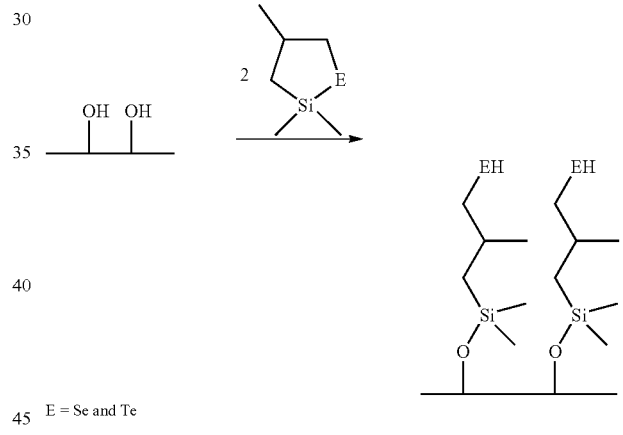

E = Se and Te

Scheme IV

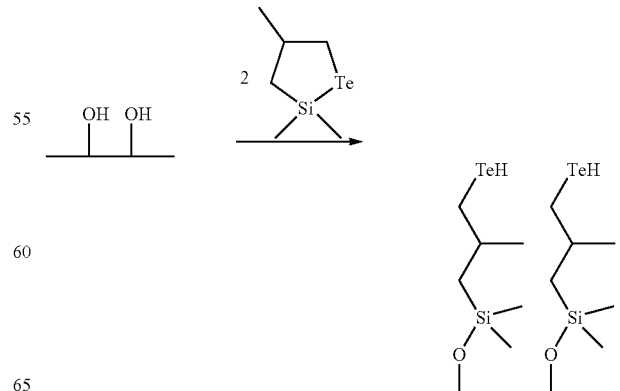

As described by Harmgarth et al (Zeaschrift für Anorganische and Allgemeine Chemie, 2017, 1150-1166) for GST films, a variety of precursors may be utilized to cleanly grow films once a tellurium atom is available as part of an initiating layer for deposition. Accordingly, substrates prepared from the inventive materials should be effective for growing clean films.

Another interesting comparison between chalcogenosilacyclopentanes and silacyclopentanes is in the relative shift of the Si—Me peaks in the ¹H NMR spectrum. The sulfur species Si—S has the shift most typically associated with Si—CH moieties. However, an increase in the size and a decrease in the electronegativity of the heteroatom results in a noticeable upfield shift of the methyl peaks. The change in shift indicates a stronger partial positive charge on the Si atom and thus an increase in the Lewis acidity of the Si, making the Si-heteroatom bond more susceptible to heterolytic cleavage and thus more reactive to nucleophiles and protic substrates. Further, a comparison of the general bond dissociation energies of Si-heteroatom bonds indicates that Si—Se and Si—Te exhibit similar energies, while Si—N is weaker and Si—S is considerably stronger. While these values only represent homolytic cleavage, they are a good indication of bond strength, the thermodynamic driver for ring-opening reaction with hydroxyl and other groups, being favorable.

The invention will now be described in connection with the following, non-limiting examples.

Example 1: Synthesis of
2,2,4-Trimethyl-1-selena-2-silacyclopentane

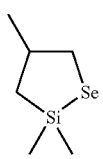

To freshly cut Li metal (13.8g, 1.9 mol) in 500 mL THF was added a solution of a catalytic amount of diphenylacetylene (8.8 g, 0.05 mol) in an additional 300 mL of THF. The addition was slightly exothermic and resulted in a reddish-brown solution. After the exotherm ceased (about 90 min.), selenium (75 g, 0.9 mol) was added via a powder addition funnel in small amounts, resulting in a large exotherm. The resulting mixture was heated at reflux for 8 hours to ensure maximum Li consumption. A solution of 175.88g (0.9 mol) 3-chloroisobutyldimethylchlorosilane (commercially available from Gelest) and 1.35 g (0.01 mol) of $BF_3 \cdot Et_2O$ was prepared and added dropwise to the $Li_2Se$, resulting in an exotherm. The reaction was refluxed for 8 hours. All volatiles were removed from the reaction at high vacuum and the resulting mixture was fractionally distilled (Vigreux column) in a fresh setup to give 2,2,4-trimethyl-1-selena-2-silacyclopentane (b.p.: 63-4° C./10 mm; density 1.195 g/mL). The title compound was isolated as a yellow-orange liquid in 28.7% yield. GC-MS and NMR are consistent with the structure. ¹H NMR ($CDCl_3$, 400 MHz): δ0.45 (s, 3H), 0.51 (s, 3H), 0.65 (dd, 1H, J=11.6, 14.0 Hz), 1.13 (d, 3H, J=6.4 Hz), 1.22 (ddd, 1H, J=1.6, 4.8, 14.0 Hz), 2.18 (m, 1H), 2.52 (t, 1H, J=10 Hz), 2.89 (ddd, 1H, J=2.0, 4.8, 10.0 Hz).

Example 2: Synthesis of
2,2,4-trimethyl-1-tellura-2-silacyclopentane

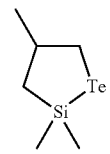

To freshly cut Li metal (10.9 g, 1.6 mol) in 200 mL THF was added a solution of a catalytic amount of diphenylacetylene (7.3 g, 0.04 mol) in an additional 200 mL of THF. The addition was slightly exothermic and resulted in a reddish-brown solution. After the exotherm ceased (about 90 min), Te powder (100 g, 0.8 mol) was added via a powder addition funnel in small amounts, resulting in a large exotherm. The resulting mixture was heated at reflux for 8 hours to ensure maximum Li consumption. A solution of 145.1 g (0.8 mol) chloroisobutyldimethylchlorosilane (commercially available from Gelest) and 1.1 g (0.01 mol) of $BF_3 \cdot Et_2O$ was prepared and added dropwise to the $Li_2Te$, resulting in an exotherm. The reaction was refluxed for 8 hours. All volatiles were removed from the reaction at high vacuum and the resulting mixture was fractionally distilled (Vigreux column) in a fresh setup to give 2,2,4-trimethyl-1-tellura-2-silacyclopentane (b.p. 61-3° C./4). The title compound was isolated as a colorless liquid in 30.3% yield. Upon exposure to light it began to take on an orange hue. GCMS and NMR verified the structure. ¹H NMR ($CDCl_3$, 400 MHz): δ0.61 (s, 3H), 0.67 (s, 3H), 0.72 (dd, 1H, J=10.8, 14.0 Hz), 1.14 (d, 3H, J=6.4 Hz), 1.34 (ddd. 1H, J=1.6, 3.6, 13.6 Hz), 2.12 (m, 1H), 2.62 (t, 1H, J=10 Hz), 2.91 (ddd, 1H, J=1.6, 4.4, 10.4 Hz).

It will be appreciated by those skilled in the art that changes could be made to the embodiment described above without departing from the broad inventive concepts thereof Also, based on this disclosure, a person of ordinary skill in the art would further recognize that the relative proportions of the components illustrated above could be varied without departing from the spirit and scope of the invention. It is understood, therefor, that this invention is not limited to that particular embodiment disclosed, but it is intended to cover modifications within the spirit and scope of the present invention as defined by the appended claims.

We claim:

1. A chalcogenosilacyclopentane having formula (I), wherein $R_a$, $R_b$, $R_c$, $R_d$, $R_e$, and $R_f$ are each independently selected from the group consisting of hydrogen, an alkyl group having one to about eight carbon atoms, an alkoxy group having one to about eight carbon atoms, an aromatic group, and an ether group, and wherein R and R' are different and are each independently selected from the group consisting of hydrogen, an alkyl group having one to about eight carbon atoms, an alkoxy group having one to about eight carbon atoms, an aromatic group, and an ether group:

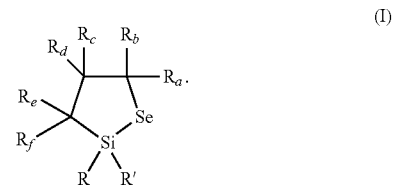

(I)

2. A chalcogenosilacyclopentane having formula (II), wherein $R_a$, $R_b$, $R_c$, $R_d$, $R_e$, and $R_f$ are each independently selected from the group consisting of hydrogen, an alkyl group having one to about eight carbon atoms, an alkoxy group having one to about eight carbon atoms, an aromatic group, and an ether group, and wherein R and R' are different and are each independently selected from the group consisting of hydrogen, an alkyl group having one to about eight carbon atoms, an alkoxy group having one to about eight carbon atoms, an aromatic group, and an ether group:

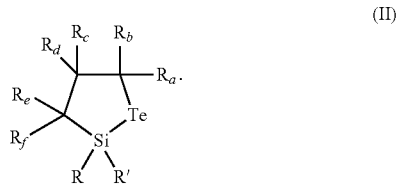

(II)

3. A reaction product of a chalcogenosilacyclopentane according to claim 1 with a protic substance.

4. The reaction product according to claim 3, wherein the protic substance is a substrate.

5. A method for forming an initiating layer for ALD on a protic substrate, the method comprising reacting the protic substrate with a chalcogenosilacyclopentane according to claim 1.

6. A reaction product of a chalcogenosilacyclopentane according to claim 2 with a protic substance.

7. The reaction product according to claim 6, wherein the protic substance is a substrate.

8. A method for forming an initiating layer for ALD on a protic substrate, the method comprising reacting the protic substrate with a chalcogenosilacyclopentane according to claim 2.

9. A chalcogenosilacyclopentane having formula (I), wherein $R_a$, $R_b$, $R_c$, $R_d$, $R_e$, and $R_f$ are each independently selected from the group consisting of hydrogen, an alkyl group having one to about eight carbon atoms, an alkoxy group having one to about eight carbon atoms, an aromatic group, and an ether group, and wherein R and R' are different and are each independently selected from the group consisting of hydrogen, an alkyl group having one to two carbon atoms, an alkoxy group having one to about eight carbon atoms, an aromatic group, and an ether group:

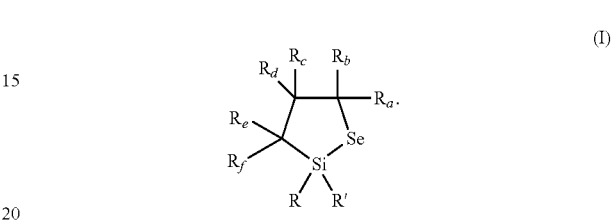

(I)

10. A reaction product of a chalcogenosilacyclopentane according to claim 9 with a protic substance.

11. The reaction product according to claim 10, wherein the protic substance is a substrate.

12. A method for forming an initiating layer for ALD on a protic substrate, the method comprising reacting the protic substrate with a chalcogenosilacyclopentane according to claim 9.

13. The chalcogenosilacyclopentane having formula (I) according to claim 9, wherein R and R' are different and are each independently selected from the group consisting of hydrogen, an alkoxy group having one to about eight carbon atoms, an aromatic group, and an ether group.

* * * * *